US012804820B2

(12) United States Patent
Ito et al.

(10) Patent No.: US 12,804,820 B2
(45) Date of Patent: Nov. 17, 2026

(54) STRETCHABLE DEVICE

(71) Applicant: Murata Manufacturing Co., Ltd., Nagaokakyo (JP)

(72) Inventors: Hiromitsu Ito, Nagaokakyo (JP); Yui Nakamura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 258 days.

(21) Appl. No.: 18/820,555

(22) Filed: Aug. 30, 2024

(65) Prior Publication Data

US 2024/0422919 A1 Dec. 19, 2024

Related U.S. Application Data

(63) Continuation of application No. PCT/JP2023/007286, filed on Feb. 28, 2023.

(30) Foreign Application Priority Data

Mar. 8, 2022 (JP) ................................ 2022-035572

(51) Int. Cl.
*H05K 3/36* (2006.01)

(52) U.S. Cl.
CPC .................................. *H05K 3/361* (2013.01)

(58) Field of Classification Search
USPC .......................................................... 174/254
See application file for complete search history.

(56) References Cited

U.S. PATENT DOCUMENTS

| | | | |
|---|---|---|---|
| 10,921,657 | B2 | 2/2021 | Abe et al. |
| 11,178,764 | B2 | 11/2021 | Uno et al. |
| 11,327,373 | B2 | 5/2022 | Abe et al. |
| 11,668,984 | B2 | 6/2023 | Abe et al. |
| 11,682,615 | B2 | 6/2023 | Ronay et al. |

(Continued)

FOREIGN PATENT DOCUMENTS

| | | | |
|---|---|---|---|
| JP | H05-243713 | A | 9/1993 |
| JP | H08-138774 | A | 5/1996 |

(Continued)

OTHER PUBLICATIONS

International Search Report received for PCT Patent Application No. PCT/JP2023/007286, mailed on May 23, 2023, 2 pages (English Translation only).

*Primary Examiner* — Andargie M Aychillhum
(74) *Attorney, Agent, or Firm* — ArentFox Schiff LLP

(57) ABSTRACT

A stretchable device including: a first substrate; a stretchable first wiring on the first substrate; a second substrate facing the first substrate in a thickness direction of the first substrate; a stretchable second wiring on the second substrate; a first protective layer covering a part of the first wiring; a second protective layer covering a part of the second wiring; and a connection member in contact with an outer surface at an end portion of each of the first and the second wirings and electrically connecting the first and the second wirings, and in contact with an end surface of each of the first and the second protective layers, wherein at least a pair out of (1) the first protective layer and the second wiring and (2) the second protective layer and the first wiring is separated from each other with the connection member interposed therebetween.

19 Claims, 11 Drawing Sheets

(56) References Cited

U.S. PATENT DOCUMENTS

| | | | |
|---|---|---|---|
| 11,688,677 | B2 | 6/2023 | Ronay et al. |
| 2019/0250447 | A1 | 8/2019 | Abe et al. |
| 2020/0344880 | A1 | 10/2020 | Uno et al. |
| 2020/0381349 | A1 | 12/2020 | Ronay et al. |
| 2021/0157192 | A1 | 5/2021 | Abe et al. |
| 2021/0272891 | A1 | 9/2021 | Ronay et al. |
| 2021/0296600 | A1 | 9/2021 | Uno et al. |
| 2021/0360814 | A1* | 11/2021 | Hong .................... G06F 1/1652 |
| 2022/0229324 | A1 | 7/2022 | Abe et al. |
| 2024/0047334 | A1 | 2/2024 | Ronay et al. |

FOREIGN PATENT DOCUMENTS

| | | | |
|---|---|---|---|
| JP | 2005-197001 | A | 7/2005 |
| JP | 2007-035546 | A | 2/2007 |
| JP | 2018-010967 | A | 1/2018 |
| JP | 2019-139073 | A | 8/2019 |
| WO | 2016/152543 | A1 | 9/2016 |
| WO | 2019/138855 | A1 | 7/2019 |
| WO | 2020/243254 | A1 | 12/2020 |

* cited by examiner

STRETCHABLE DEVICE

CROSS REFERENCE TO RELATED APPLICATIONS

The present application is a continuation of International application No. PCT/JP2023/007286, filed Feb. 28, 2023, which claims priority to Japanese Patent Application No. 2022-035572, filed Mar. 8, 2022, the entire contents of each of which are incorporated herein by reference.

TECHNICAL FIELD

The present disclosure relates to a stretchable device.

BACKGROUND ART

Conventionally, a stretchable device in which wirings are mounted on a stretchable substrate has been known. The stretchable device can be used by being worn on a human body. In addition, conventionally, electrical connection between substrates having main surfaces on which electrodes or wirings are provided has been performed.

Patent Document 1 discloses that in a case where a circuit pattern layer is formed by printing a conductive paste on a substrate, and a metal capable of causing migration of silver or the like is used as the conductive paste, the occurrence of migration is prevented by forming an insulating layer so as to cover the circuit pattern layer. In addition, Patent Document 2 relates to a technique for connection between electrode terminals of a substrate, and discloses a pressure bonding device and a pressure bonding method for connecting electrode terminals with a conductive connection material interposed therebetween. Specifically, the second electrode terminal provided on the second substrate and the third electrode terminal provided on the third substrate are disposed so as to face each other, and are connected to each other with a conductive connecting material, such as an anisotropic conductive film (ACF), interposed therebetween.

Patent Document 1: Japanese Patent Application Laid-Open No. H5-243713

Patent Document 2: Japanese Patent Application Laid-Open No. 2007-35546

SUMMARY OF THE DISCLOSURE

Here, the inventors of the present application have found that there is a matter to be improved in the following points when mutually facing wirings (corresponding to the electrode terminals) are connected to each other with a conductive connection material, that is, a connection member interposed therebetween. Specifically, in a case where the wirings are connected by the connection member and a metal material such as Ag is used as a wiring material, it is conceivable that a part of each wiring is covered with an insulating protective layer and the wirings are connected by the connection member in order to prevent the occurrence of migration.

In this case, there may be a configuration in which the connection member is surrounded by the wirings facing each other and the protective layer covering the part of each wiring. However, in the configuration, there is a possibility that it is difficult to secure a space in which the connection member flows as the connection member is pressurized at the time of pressure bonding for electrical connection between the wirings. As a result, it may be difficult to secure connection reliability between the wirings by the connection member.

Therefore, an object of the present disclosure is to provide a stretchable device capable of securing connection reliability between wirings facing each other and of preventing the occurrence of migration in the wirings.

To achieve the above object, in an embodiment of the present disclosure, a stretchable device is provided, which includes: a first substrate; a stretchable first wiring on the first substrate; a second substrate facing the first substrate in a first direction that is a thickness direction of the first substrate; a stretchable second wiring on the second substrate; a first protective layer covering a part of the stretchable first wiring; a second protective layer covering a part of the stretchable second wiring; and a connection member in contact with an outer surface at an end portion of each of the stretchable first wiring and the stretchable second wiring so as to electrically connect the stretchable first wiring and the stretchable second wiring, and in contact with an end surface of each of the first protective layer and the second protective layer, wherein at least a pair out of (1) the first protective layer and the stretchable second wiring and (2) the second protective layer and the stretchable first wiring is separated from each other with the connection member interposed therebetween.

According to the stretchable device according to the embodiment of the present disclosure, it is possible to secure connection reliability between the wirings facing each other and prevent migration in the wirings.

DESCRIPTION OF THE PREFERRED EMBODIMENTS

Figure 1A:
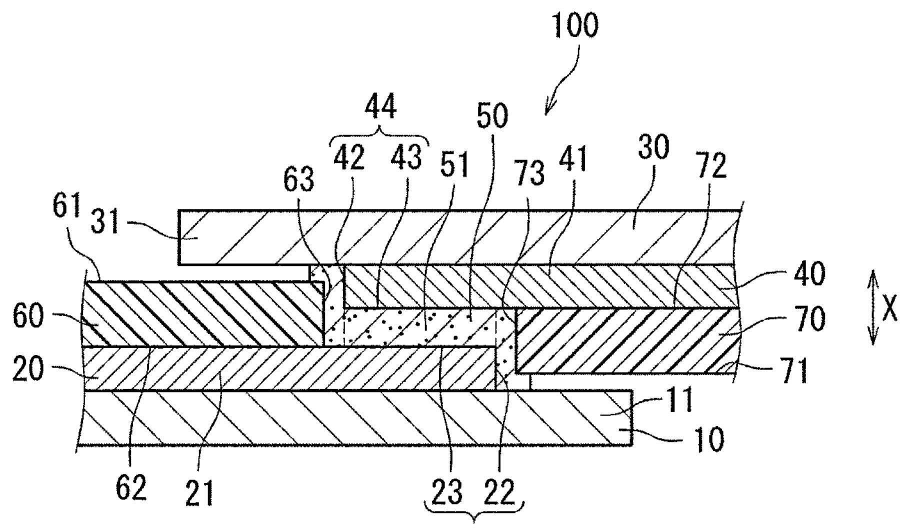
FIG. 1A is a partial sectional view (corresponding to a sectional view along a line segment A-A' in FIG. 1C) schematically illustrating a stretchable device according to a first embodiment of the present disclosure.

Hereinafter, embodiments of the present disclosure will be described in detail with reference to the drawings. In each embodiment, a difference from description before the embodiment will be mainly described. Particularly, similar functions and effects achieved by similar configurations will not be mentioned sequentially for each embodiment. Among constituent elements in an embodiment below, a constituent element not described in an independent claim is described as an optional constituent element. Further, sizes and ratios of sizes of constituent elements illustrated in the drawings are not necessarily strict. Further, in the drawings, substantially the same configurations are denoted by the same reference numerals, and redundant description may be omitted or simplified.

First Embodiment

A configuration of a stretchable device 100 according to a first embodiment will be described with reference to FIGS. 1A to 1D.

Figure 1B:
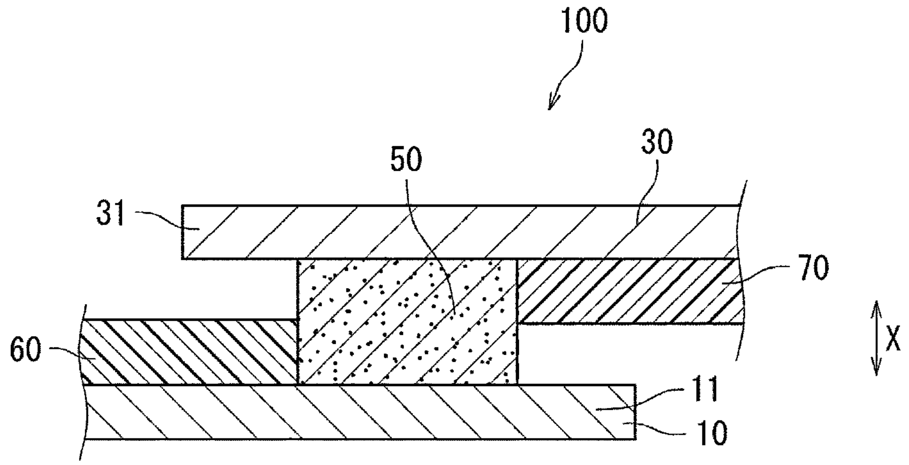
FIG. 1B is a partial sectional view (corresponding to a sectional view along a line segment B-B' in FIG. 1C) schematically illustrating the stretchable device according to the first embodiment of the present disclosure.
Figure 1C:
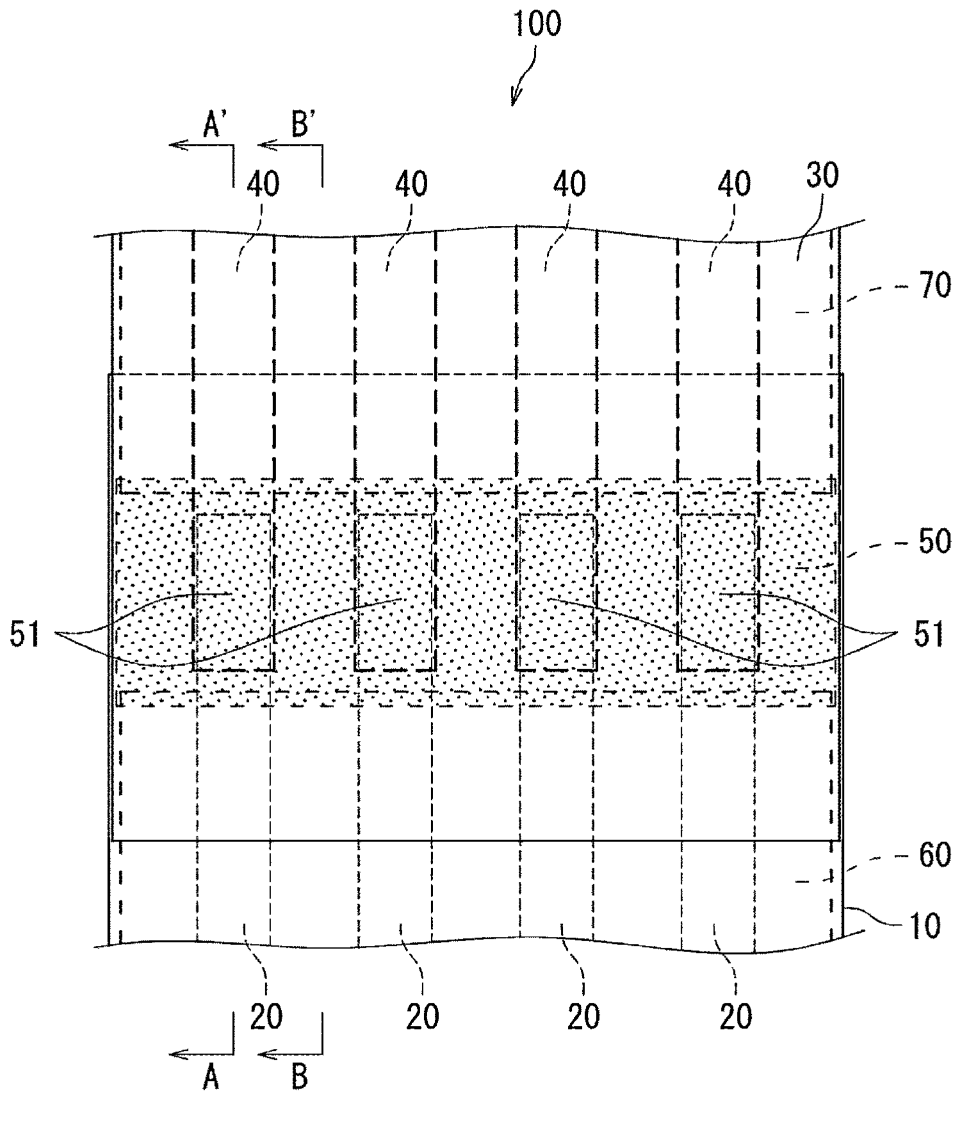
FIG. 1C is a partial plan view schematically illustrating the stretchable device according to the first embodiment of the present disclosure.
Figure 1D:
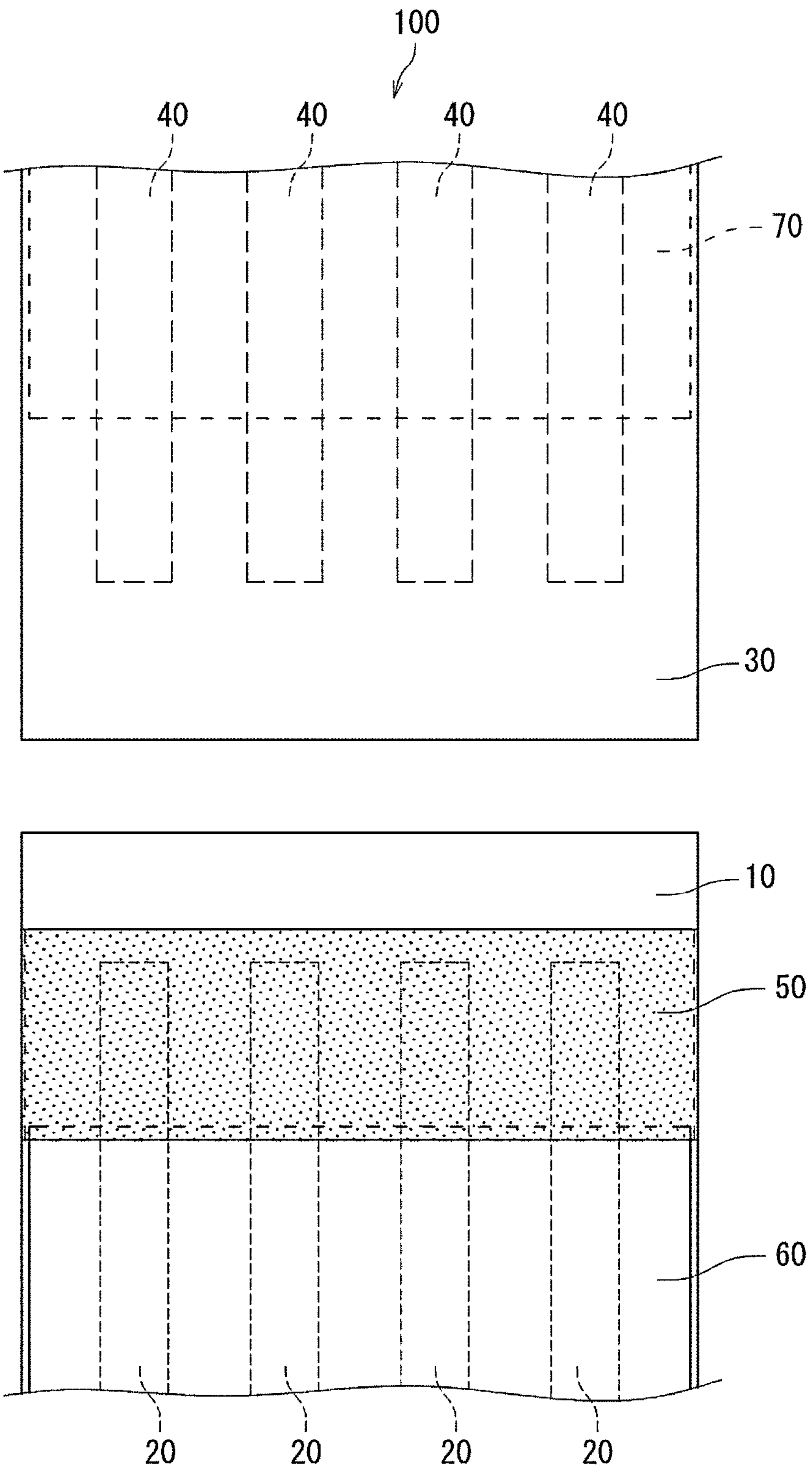
FIG. 1D is an exploded partial plan view schematically illustrating the stretchable device according to the first embodiment of the present disclosure.

FIG. 1A is a partial sectional view (corresponding to a sectional view along a line segment A-A' in FIG. 1C) schematically illustrating the stretchable device according to the first embodiment of the present disclosure. FIG. 1B is a partial sectional view (corresponding to a sectional view along a line segment B-B' in FIG. 1C) schematically illustrating the stretchable device according to the first embodiment of the present disclosure. FIG. 1C is a partial plan view schematically illustrating the stretchable device according to the first embodiment of the present disclosure. FIG. 1D is an exploded partial plan view schematically illustrating the stretchable device according to the first embodiment of the present disclosure.

In the sectional views of the present specification, a first direction that is a thickness direction of a first substrate to be described later is indicated by a double-headed arrow X. A thickness direction of a second substrate to be described later coincides with the first direction which is the thickness direction of the first substrate. In the drawings, a connection member 50 to be described later is indicated by dot hatching for convenience.

The stretchable device 100 includes the first substrate 10, a stretchable first wiring 20 provided on the first substrate 10, the second substrate 30 facing the first substrate 10 in the first direction X which is the thickness direction of the first substrate 10, a stretchable second wiring 40 provided on the second substrate 30, a connection member 50 electrically connecting the first wiring 20 and the second wiring 40, a first protective layer 60 covering a part of the first wiring 20, and a second protective layer 70 covering a part of the second wiring 40.

Note that the term "on" in the present specification may not coincide with the upper and lower sides when the stretchable device 100 is used. More specifically, as illustrated in FIG. 1A, since the first wiring 20 and the second wiring 40 can be electrically connected, the term "on the first substrate 10" refers to a main surface side of the first substrate 10 close to the second substrate 30, and the term "on the second substrate 30" refers to a main surface side of the second substrate 30 close to the first substrate 10. Furthermore, "above" with respect to a certain element includes a position located above the certain element and away from the certain element, that is, a state of being located above the certain element with another object interposed therebetween, a state of being located above the certain element and spaced apart from the certain element, and a state of being located immediately above the certain element and in contact with the certain element.

Hereinafter, constituent elements of the stretchable device 100 will be described. After each constituent elements is described, characteristic portions of the first embodiment will be described.

First, the first substrate 10 and the second substrate 30 may be stretchable substrates. Since these substrates are stretchable, it is possible to reduce the risk of breakage in expansion and contraction at the time of use of the stretchable device 100 without suppressing expansion and contraction of the first wiring 20 and the second wiring 40.

Examples of the stretchable substrates include sheet-shaped or film-shaped substrates made of a stretchable resin material. Examples of the resin material include thermoplastic polyurethane. Thicknesses of the stretchable substrates are not particularly limited, but are preferably 1 mm or less, more preferably 100 μm or less, still more preferably 50 μm or less from the viewpoint of preventing stretching of a surface of a living body from being impaired when the stretchable device is attached to the living body. In addition, the thicknesses of the stretchable substrates are preferably 1 μm or more from the viewpoint of securing predetermined strength.

From the viewpoint of improving the electrical connection reliability of both wirings, the first wiring 20 and the second wiring 40 can be connected to each other and face each other along the first direction X with the connection member 50 interposed therebetween. That is, the connection member 50 may have a connection region that connects the first wiring 20 and the second wiring 40 facing or overlapping each other.

A dimension of the connection region 51 is not particularly limited, but is preferably 0.5 mm to 20 mm. In a case where the connection region 51 is 0.5 mm or more, the connection area is increased, and the connection reliability is improved. Meanwhile, since the stretchability of portions of the stretchable wirings in contact with the connection member is reduced, the connection region 51 is 20 mm or less, so that it is possible to suppress a decrease in the stretching performance of the stretchable device 100. That is, by setting the dimension of the connection region 51 to 0.5 mm to 20 mm, it is possible to provide the stretchable device 100 that has high connection reliability and in which a decrease in the stretching performance is suppressed.

Note that the dimension of the connection region 51 described above is a dimension in the vertical direction in FIG. 1C and the horizontal direction in FIG. 1A. As illustrated in FIG. 1A, the connection region 51 has the dimension in the width direction of the first wiring 20 and the second wiring 40. As illustrated in FIG. 1C, the stretchable device 100 may include a plurality of connection regions 51. In FIG. 1C, the connection member 50 is disposed in the entire connection region 51, but may be disposed in at least a part of the connection region 51.

As illustrated in FIG. 1A, the first wiring 20 has an end surface 22 at an end portion 21 thereof and a main surface 23 (corresponding to an outer surface 24) continuous with the end surface 22. The second wiring 40 has an end surface 42 at an end portion 41 thereof and a main surface 43 (corresponding to an outer surface 44) continuous with the end surface. In addition, both the first wiring 20 and the second wiring 40 can be elongated. In this case, the main surface 23 of the first wiring 20 and the main surface 43 of the second wiring 40 may extend along the longitudinal direction.

In addition, the first wiring 20 and the second wiring 40 can be made of, for example, a mixture containing a metal material such as Ag, Cu, or Ni as conductive particles and an elastomer-based resin such as a silicone resin. The average diameter of the conductive particles is not particularly limited, but is preferably 0.01 μm to 10 μm. The shapes of the conductive particles are preferably spherical. The thicknesses, widths, and lengths of the first wiring 20 and the second wiring 40 are not particularly limited. For example, by making the width of the first wiring 20 larger than the width of the second wiring 40, it is possible to suppress a connection failure due to misalignment. The same applies to a case where the width of the second wiring 40 is made larger than the width of the first wiring 20.

As described above, the connection member 50 electrically connects the first wiring 20 and the second wiring 40. Examples of the connection member 50 include an anisotropic conductive film (ACF), a conductive paste, and solder. The connection member 50 preferably contains a resin and a plurality of conductive particles provided in the resin. When the conductive particles contained in the connection member 50 come into contact with the first wiring 20 and the second wiring 40, the first wiring 20 and the second wiring 40 are electrically connected.

An example of a method of electrically connecting the first wiring 20 and the second wiring 40 using the connection member 50 is a method of arranging the connection member 50 between the first wiring substrate side (including the first substrate 10 and the first wiring 20) and the second wiring substrate side (including the second substrate 30 and the second wiring 40), and then performing pressure bonding such as thermal pressure bonding.

In particular, in an aspect in which the connection member 50 contains conductive particles, in a case where the distance between the first wiring 20 and the second wiring 40 in the first direction is longer than the maximum diameter of the conductive particles, the first wiring 20 and the second wiring 40 cannot be electrically connected. Therefore, by performing the above-described pressure bonding, the conductive particles come into contact with the first wiring 20 and the second wiring 40, and the first wiring 20 and the second wiring 40 can be suitably electrically connected.

In addition, by the pressure bonding, the thickness of the connection member 50 is reduced and the height of the entire stretchable device can be reduced. In a case where the first wiring 20 and the second wiring 40 are electrically connected before the pressure bonding, pressurization may not be performed. Further, in a case where the connection member 50 has adhesiveness, it is not necessary to perform pressurization and heating.

The first protective layer 60 is disposed so as to be able to face an end portion 31 of the second substrate 30 between the second substrate 30 and the first wiring 20 in the first direction X. In addition, the second protective layer 70 is disposed so as to be able to face an end portion 11 of the first substrate 10 between the first substrate 10 and the second wiring 40 in the first direction X.

Here, the second substrate 30 may be deformed toward the first substrate 10 due to an external force, the above-described pressure bonding, or the like. At this time, in a case where the first wiring 20 is exposed, the first wiring 20 and the second substrate 30 may come into contact with each other, and the first wiring 20 may be broken. Similarly, the first substrate 10 may be deformed toward the second substrate 30 due to an external force, the above-described pressure bonding, or the like. At this time, in a case where the second wiring 40 is exposed, the second wiring 40 and the first substrate 10 may come into contact with each other, and the second wiring 40 may be broken.

In this regard, by disposing the first protective layer 60 and the second protective layer as described above, contact between the second substrate 30 and the first wiring 20 and contact between the first substrate 10 and the second wiring 40 can be reduced. Accordingly, breakage of the first wiring 20 and the second wiring 40 can be suppressed. Note that, in FIGS. 1A to 1D, an end portion of the first substrate 10 on the side opposite to the end portion 11 and an end portion of the second substrate 30 on the side opposite to the end portion 31 are not illustrated for convenience.

The first protective layer 60 includes a first main surface 62 in contact with the first wiring 20, a second main surface 61 located on the side opposite to the first main surface 62 and facing the second substrate 30, and an end surface 63 connecting the first main surface 62 and the second main surface 61. The second protective layer 70 includes a first main surface 72 in contact with the second wiring 40, a second main surface 71 located on the side opposite to the first main surface 72 and facing the first substrate 10, and an end surface 73 connecting the first main surface 72 and the second main surface 71.

Specific examples of the first protective layer 60 and the second protective layer 70 preferably include a resin material, or a mixture of a resin material and an inorganic material, and examples of the resin material include elastomer-based resins such as urethane-based, styrene-based, olefin-based, silicone-based, fluorine-based, nitrile rubber, latex rubber, vinyl chloride, ester-based, and amide-based resins, epoxy, phenol, acrylic, polyester, imide-based, rosin, cellulose, polyethylene terephthalate-based resins, polyethylene naphthalate-based resins, and polycarbonate-based resins. In addition, the first protective layer 60 and the second protective layer 70 preferably have insulating properties. Since the first protective layer 60 and the second protective layer 70 have insulating properties, it is possible to suitably suppress the occurrence of ion migration in portions of the wirings covered with these protective layers.

The maximum thickness or average thickness of the first protective layer 60 and the second protective layer 70 is preferably 1 μm to 100 μm. By setting the thicknesses of these protective layers to 1 μm or more, contact between the first wiring 20 and the second substrate 30 and contact between the second wiring 40 and the first substrate 10 can be suitably suppressed. In addition, by setting the thicknesses of these protective layers to 100 μm or less, the height of the stretchable device as a whole can be reduced.

Characteristic Portions of First Embodiment

Characteristic portions of the first embodiment will be described below based on the contents of each constituent element of the stretchable device 100 described above.

In the first embodiment, the connection member 50 is in contact with the outer surfaces 24 and 44 at the end portions of the first wiring 20 and the second wiring 40 and the end surfaces 63 and 73 of the first protective layer 60 and the second protective layer 70, respectively. In addition, at least a pair out of a pair of the first protective layer 60 and the second wiring 40 and a pair of the second protective layer 70 and the first wiring 20 is separated from each other with the connection member 50 interposed therebetween. In the first embodiment, the end surfaces 63 and 73 of the protective layers 60 and 70 can be vertical surfaces. In this case, the end surface 63 of the first protective layer 60 may be located on the outer side of the outer surface 44 of the second wiring 40, specifically, the end surface, and/or the end surface 73 of the second protective layer 70 may be located on the outer side of the outer surface 24 of the first wiring 20, specifically, the end surface.

According to the above features, a space can be formed between the outer surface at the end portion of at least one of the first wiring 20 and the second wiring 40 and the protective layer facing the outer surface. By forming the space, at the time of pressure bonding, the connection member 50 can flow through the space to the outer surface of the wiring, specifically, to the outer side of the end surface of the wiring. As a result, as viewed from the first direction X, at least one of the first protective layer 60 and the second protective layer 70 can be disposed so as to overlap the connection member 50. When the mode illustrated in FIG. 1A is taken as an example, the connection member 50 can contact not only the end surfaces 63 and 73 (vertical surfaces) which are vertical surfaces but also the second main surfaces 61 and 71 of the protective layers. As a result, the protective layers 60 and 70 can be disposed so as to overlap the connection member 50 as viewed from the first direction X.

As a result, the outer surface 24 at the end portion of the first wiring 20 can be more suitably covered with the connection member 50 in addition to the first protective layer 60. In addition, the outer surface 44 at the end portion of the second wiring 40 can be more suitably covered with the connection member 50 in addition to the second protective layer 70. Therefore, as a whole, the occurrence of ion migration in the wirings can be suitably prevented. Furthermore, since the connection member 50 can flow in the space to the outer surface of the wiring, specifically, to the outer side of the end surface of the wiring at the time of pressure bonding, the distance between the wirings that can be electrically connected to each other with the connection member 50 interposed therebetween can be suitably secured. As a result, the connection reliability between the wirings facing each other can be suitably secured.

From the above, according to the stretchable device 100 of the first embodiment, it is possible to secure the connection reliability between the wirings facing each other and prevent the migration in the wirings.

Further, according to the above-described features of the first embodiment, the following effects can also be obtained. Specifically, the thicknesses of regions (that is, regions included in the connection member 50 and located on the sides covering the end surfaces 22 and 42 of the protective layers) other than the connection region 51 of the connection member 50 can be larger than the thickness of the connection region 51 of the connection member 50. Therefore, it is possible to suppress a connection failure caused by misalignment due to the expansion and contraction of the wirings, and it is possible to improve the connection reliability of the connection member 50. Furthermore, when the wirings expand and contract in the width direction in FIG. 1A, further deformation of the connection member 50 along with the expansion and contraction of the wirings is suppressed by the arrangement of the protective layers 60 and 70.

Depending on the viscosity of the resin contained in the connection member 50, the connection member 50 may be deformed more than necessary. In this regard, since the protective layers 60 and 70 are in contact with the connection member 50, the connection member 50 can be selected without being limited by the viscosity. In addition, since the objects with which the connection member 50 is in contact are not only the wirings facing each other but also the protective layers 60 and 70, the contact resistance can be reduced.

It is preferable that the connection member 50 cover at least one of the entire outer surface 24 of the first wiring 20 and the entire outer surface 44 of the second wiring 40. In this case, the connection member 50 can cover the entire end surface 22 constituting the outer surface 24 of the first wiring 20 and/or the entire end surface 44 constituting the outer surface 44 of the second wiring 40. Accordingly, the connection member 50 can be brought into contact with at least one of the first substrate 10 and the second substrate 30. Since the connection member 50 contains a resin material, the connection member 50 and the substrates can be joined by the contact, and misalignment of the connection member 50 and exposure of the wirings due to expansion and contraction of the wirings can also be prevented. From the above, the occurrence of ion migration can be further prevented, and the connection reliability can be improved.

Figure 2A:
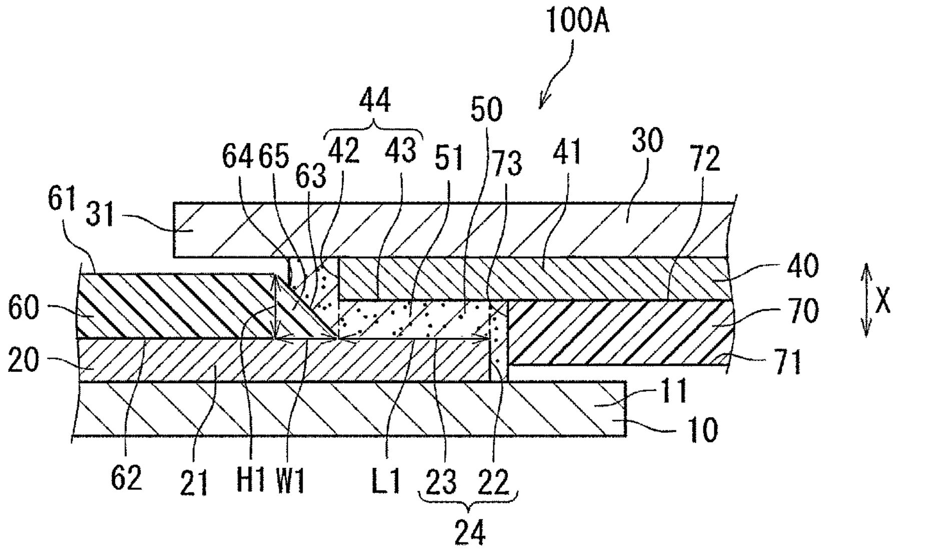
FIG. 2A is a partial sectional view (corresponding to a sectional view along a line segment C-C' in FIG. 2C) schematically illustrating a stretchable device according to a second embodiment of the present disclosure.

Note that the shape of the stretchable device 100 is not particularly limited. In the present specification, the structure in which the two substrates are connected is described as an example, but three or more substrates may be connected. In addition, the first wiring 20 is not limited to the arrangement as illustrated in FIG. 2A, and the extending direction is also not limited. Specifically, the longitudinal direction of the first substrate 10 and the extending direction of the first wiring 20 may not coincide with each other, or the first substrate 10 and the first wiring 20 may not extend in one direction. In addition, the number of first wirings 20 is not particularly limited, and may be one or more. When the number of the first wirings 20 is plural, the first wirings 20 may include a wiring not electrically connected to the second wiring 40. The same applies to the arrangement and number of second wirings 40.

Second Embodiment

A configuration of a stretchable device 100A according to a second embodiment will be described below with reference to FIGS. 2A to 2D.

Figure 2B:
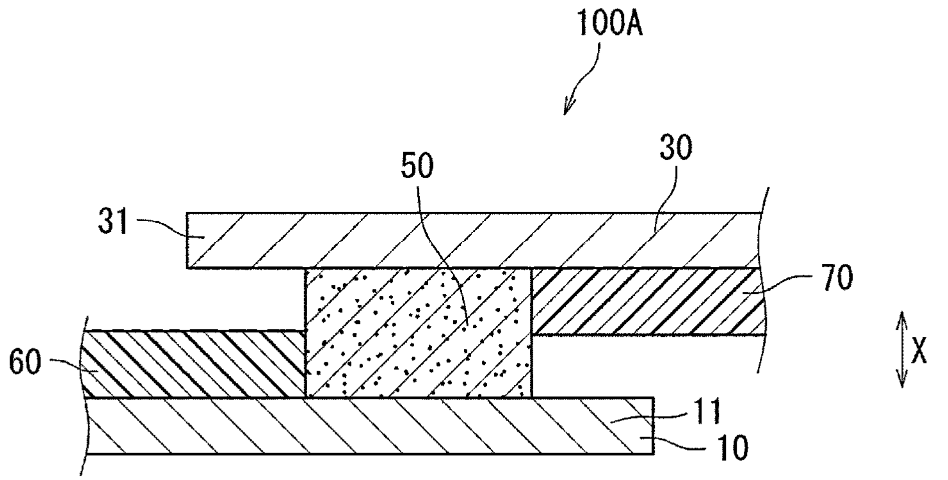
FIG. 2B is a partial sectional view (corresponding to a sectional view along a line segment D-D' in FIG. 2C) schematically illustrating the stretchable device according to the second embodiment of the present disclosure.
Figure 2C:
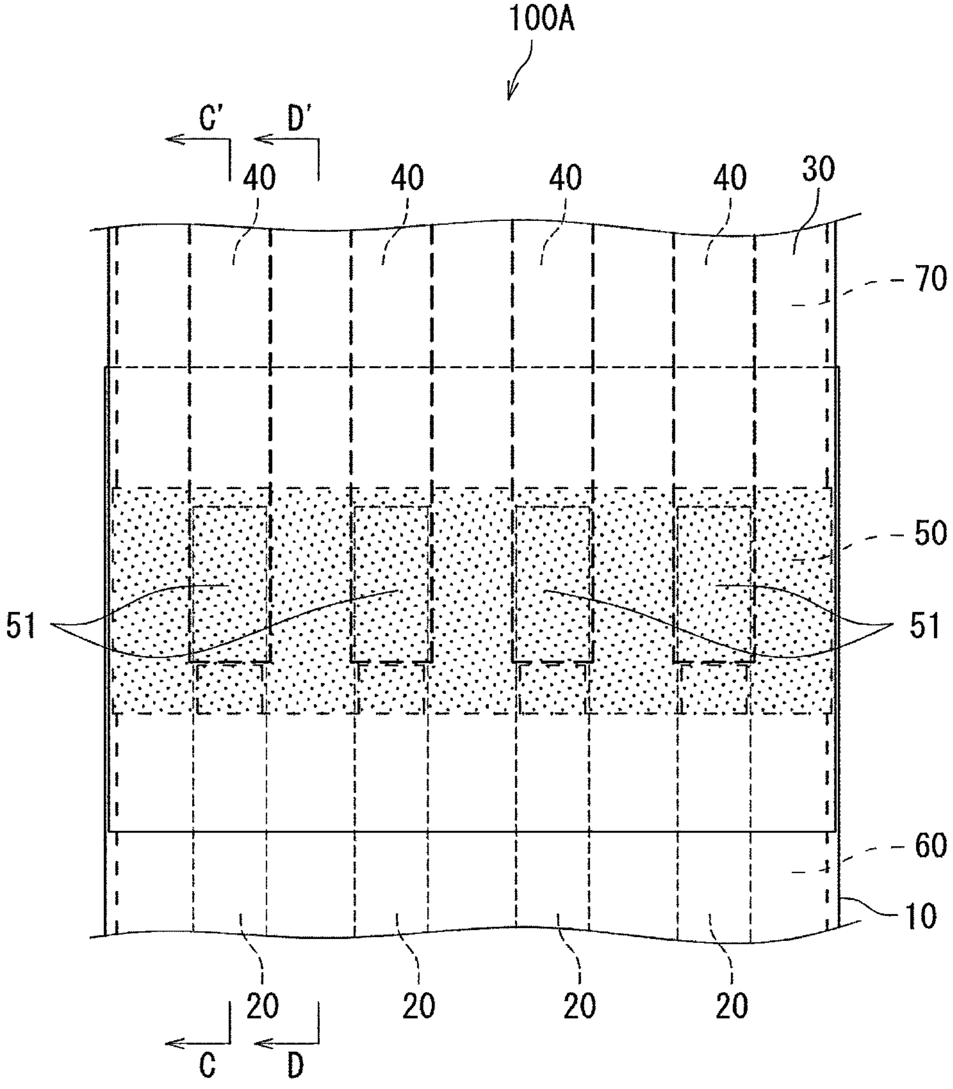
FIG. 2C is a partial plan view schematically illustrating the stretchable device according to the second embodiment of the present disclosure.
Figure 2D:
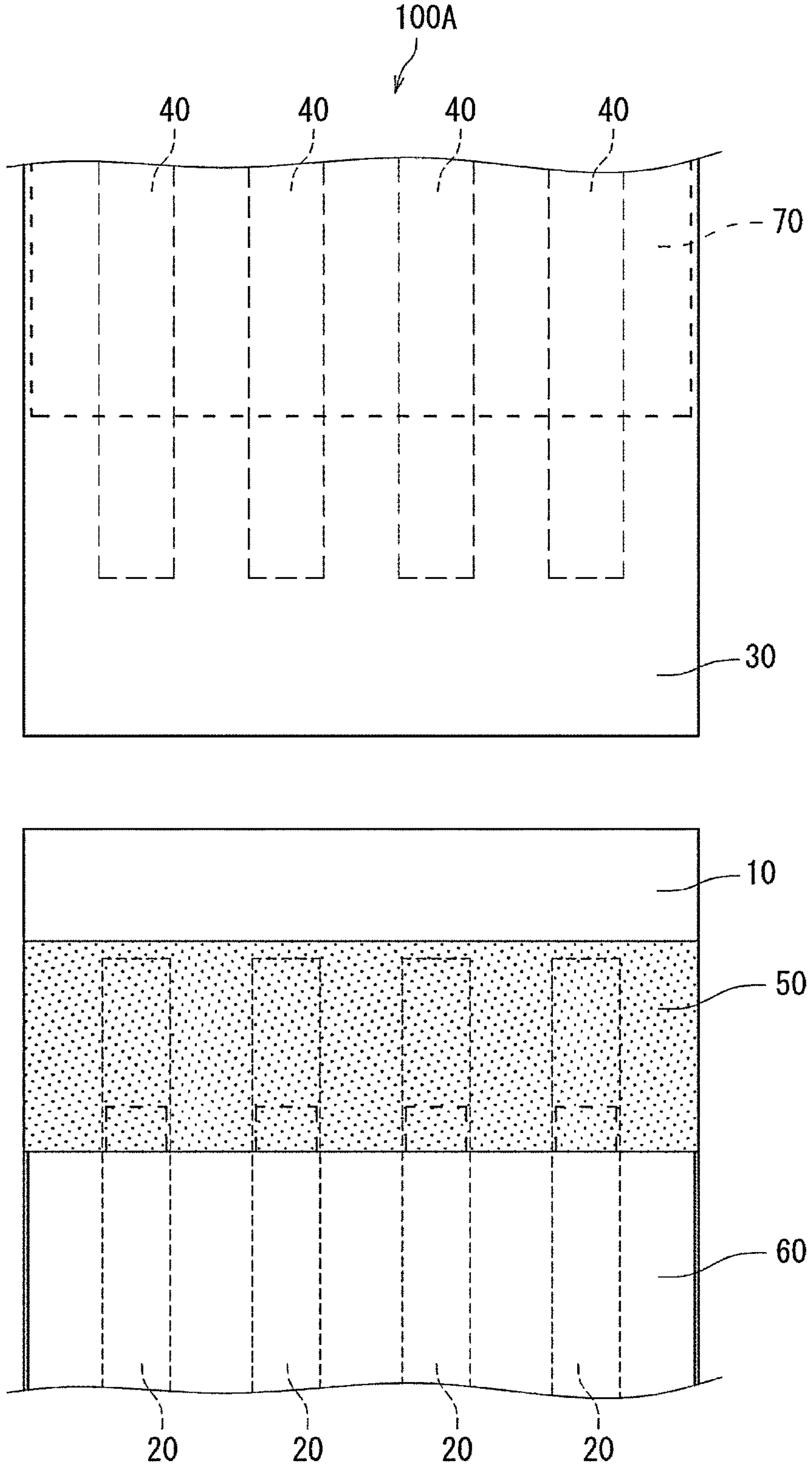
FIG. 2D is an exploded partial plan view schematically illustrating the stretchable device according to the second embodiment of the present disclosure.

FIG. 2A is a partial sectional view (corresponding to a sectional view along a line segment C-C' in FIG. 2C)

schematically illustrating the stretchable device according to the second embodiment of the present disclosure. FIG. 2B is a partial sectional view (corresponding to a sectional view along a line segment D-D' in FIG. 2C) schematically illustrating the stretchable device according to the second embodiment of the present disclosure. FIG. 2C is a partial plan view schematically illustrating the stretchable device according to the second embodiment of the present disclosure. FIG. 2D is an exploded partial plan view schematically illustrating the stretchable device according to the second embodiment of the present disclosure.

The second embodiment is different from the first embodiment in that the end surfaces 63 and 73 of a protective layer that is at least one of the first protective layer 60 and the second protective layer 70 include inclined surfaces. As compared with FIG. 2A in which the wirings are located, FIG. 2B in which the wirings are not located illustrates the end surface of the first insulating layer 60 in contact with the connection member 50 as a vertical surface. However, the present embodiment is not limited thereto, and the end surface of the first insulating layer 60 in contact with the connection member 50 may include an inclined surface not only at a portion where the wirings are located but also at a portion where the wirings are not located.

In a case where the inclined surface is included in the end surface of the protective layer, the following configuration can be adopted depending on the inclined form.

As an example, a case where the end surface 63 of the first protective layer 60 includes the inclined surface 64 will be described as an example. In this case, as illustrated in FIG. 2A, the first protective layer 60 including the inclined surface 64 and the connection member 50 may overlap each other as viewed from the first direction. That is, the connection member 50 may be located on the inclined surface 64 of the first protective layer facing the second substrate 30. In this case, a part of the connection member 50 can be in contact with the inclined surface 64 so as to extend upward from the side in contact with the first wiring 20 along the longitudinal direction of the first wiring 20.

With the configuration, compared to a case where the end surface 63 of the first protective layer 60 is a vertical surface, the inclined form of the inclined surface 64 makes it easy to cause the connection member 50 to flow to the outer surface 44 of the second wiring 40, specifically, to the outer side of the end surface 42 of the second wiring 40 at the time of pressure bonding. As a result, as compared with a case where the end surface 63 of the first protective layer 60 is a vertical surface, the end surface 42 constituting the outer surface 44 of the second wiring 40 and spaced apart and facing the inclined surface 64 is easily covered with the connection member 50. As a result, the occurrence of ion migration can be more suitably prevented. In addition, it is possible to more suitably secure the distance between the wirings that can be electrically connected to each other with the connection member 50 interposed therebetween. As a result, the connection reliability between the wirings facing each other can be more suitably secured.

In a case where the first wiring 20 and the second wiring 40 face each other as viewed from the first direction X, a part of the first protective layer 60 may overlap the connection region 51 connecting the first wiring 20 and the second wiring 40. In this case, as compared with a case where the entire first protective layer 60 is located on the outer side of the connection region 51, that is, a case where the entire first protective layer 60 does not overlap the connection region 51 as viewed from the first direction X, a bonding region between the connection member 50 and the first protective layer 60 can be made large. As a result, the bonding strength between the connection member 50 and the protective layer can be improved, and it is also possible to further suppress misalignment due to expansion and contraction of the wirings and reduce the contact resistance.

In the second embodiment, since the end surfaces 63 and 73 of a protective layer that is at least one of the first protective layer 60 and the second protective layer 70 only need to include inclined surfaces, an end surface of a protective layer that is at least one of the first protective layer 60 and the second protective layer 70 can be an inclined surface, and an end surface of the other protective layer can be a vertical surface. For example, as illustrated in FIG. 2A, the end surface 73 of the second protective layer 70 can be a vertical surface. In this case, in order to cause the connection member 50 to flow to the outer surface of each wiring, specifically, to the outer side of the end surfaces of the wirings at the time of pressure bonding, the vertical surface (end surface 73) is preferably located on the outer side of the end surface 22 of the first wiring 20.

Further, as illustrated in FIG. 2A, from the viewpoint of preventing the occurrence of ion migration in the wirings and securing the connection reliability between the wirings, a width dimension W1 of an inclined portion having the inclined surface of a protective layer that is at least one of the first protective layer 60 and the second protective layer 70, for example, an inclined portion 65 having the inclined surface 64 of the first protective layer 60 is preferably 10% to 90%, more preferably 70% or less, still more preferably 50% or less of a width dimension L1 of the connection region 51. For example, in a case where L1 is 1000 μm to 2000 μm, W1 can be 100 μm or more. The width dimension W1 of the inclined portion 65 is preferably 20% to 70%, more preferably 60% or more, and still more preferably 50% or less of the maximum height dimension H1 of the inclined portion 65. For example, in a case where H1 is 15 μm to 25 μm, W1 can be 3 μm or more.

In a case where it is assumed that the inclined surface 65 and the first main surface 62 each have a linear form, an angle formed between the inclined surface 65 and the first main surface 62 can be 5 degrees to 60 degrees, for example, 30 degrees.

Figure 3:
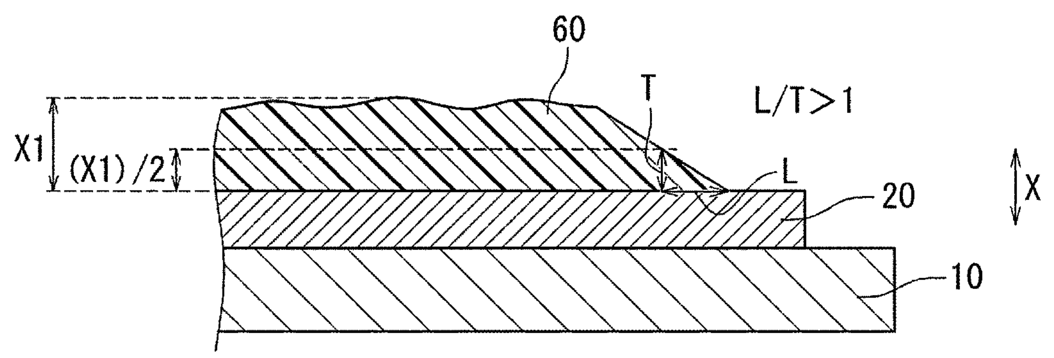
FIG. 3 is a partial enlarged sectional view schematically illustrating a protective layer having an inclined end surface.

Hereinafter, in a case where the protective layer includes an inclined surface, the inclined surface is determined by the following method. FIG. 3 is a partial enlarged sectional view schematically illustrating a protective layer having an inclined end surface.

As illustrated in FIG. 3, in the longitudinal direction (corresponding to the left-right direction) of the wirings, a point closest to the connection region 51 (see FIG. 2A and the like) in the protective layer (the first protective layer 60 is illustrated in FIG. 3) and a point closest to the connection region 51 in a virtual line segment in the protective layer are determined as an inclined surface. In other words, assuming that the distance in the width direction between the two points is L and the distance in the first direction between the two points is T, when $L>0$ and $T>0$, the first protective layer 60 includes the inclined surface 64. The relationship between the width L and the height T is preferably $L/T>1$ from the viewpoint of having the connection member 50 easily flow upward along the inclined surface. In addition, $L/T>2$ is more preferable, and $L/T>3$ is still more preferable. The term "virtual line segment" as used herein refers to a line segment at a portion where the thickness is (X1)/2 in a case where the maximum dimension of the thickness (in the vertical direction) of the protective layer (the first protective layer 60 is illustrated in FIG. 3) is X1.

Third Embodiment

Figure 4:
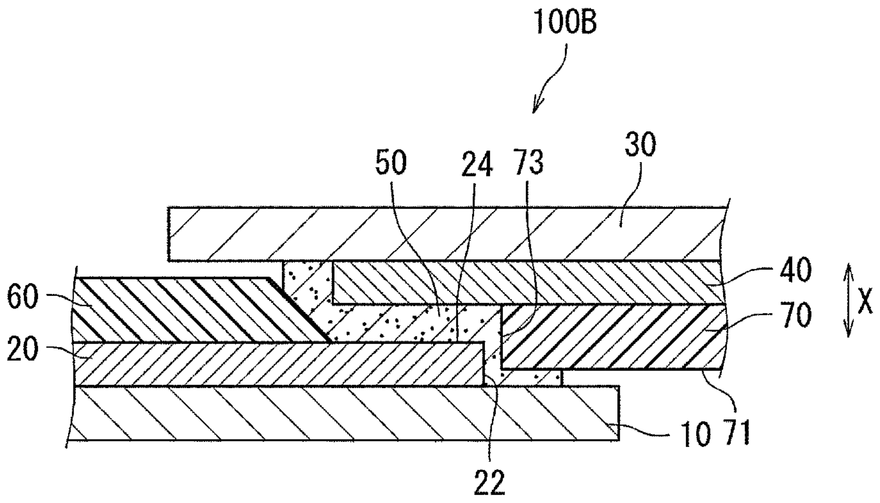
FIG. 4 is a partial sectional view schematically illustrating a stretchable device according to a third embodiment of the present disclosure.

A configuration of a stretchable device 100B according to a third embodiment will be described below with reference to FIG. 4. FIG. 4 is a partial sectional view schematically illustrating the stretchable device according to the third embodiment of the present disclosure.

As illustrated in FIG. 4, the third embodiment is different from the second embodiment in that the connection member 50 is in contact with not only the end surface 73 of the second protective layer 70 (corresponding to the protective layer having no inclined surface in FIG. 4) but also the second main surface 71.

As a result, the contact region between the connection member 50 and the second protective layer 70 is increased as compared with the second embodiment, and thus the entire outer surface 24 including the end surface 22 of the first wiring 20 can be suitably covered by the connection member 50, and the connection member 50 can also flow more. As a result, the occurrence of ion migration on the first wiring 20 side can be further prevented, and the connection reliability between the wirings can also be improved.

Fourth Embodiment

Figure 5:
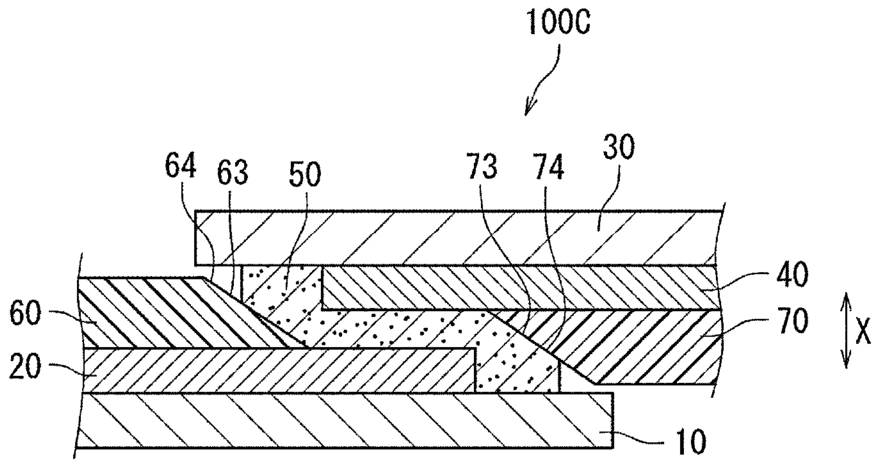
FIG. 5 is a partial sectional view schematically illustrating a stretchable device according to a fourth embodiment of the present disclosure.

A configuration of a stretchable device 100C according to a fourth embodiment will be described below with reference to FIG. 5. FIG. 5 is a partial sectional view schematically illustrating the stretchable device according to the fourth embodiment of the present disclosure.

As illustrated in FIG. 5, the fourth embodiment is different from the second embodiment and the third embodiment in that both the end surface 63 of the first protective layer 60 and the end surface 73 of the second protective layer 70 include inclined surfaces 64 and 74.

As described in the second embodiment, in a case where an end surface of at least one of the first protective layer 60 and the second protective layer 70 includes an inclined surface, it is possible to secure the connection reliability between the wirings and prevent occurrence of ion migration in the wirings. In this regard, in a case where two or more protective layers including the inclined surfaces are present, the above-described two effects can be more suitably obtained.

In the following fifth to ninth embodiments, in the drawings corresponding to the respective embodiments, a mode in which both the end surface of the first protective layer 60 and the end surface of the second protective layer 70 include inclined surfaces is illustrated. However, the present disclosure is not limited to this, and it will be concretely described that at least one of the end surface of the first protective layer 60 and the end surface of the second protective layer 70 may include an inclined surface.

Fifth Embodiment

Figure 6:
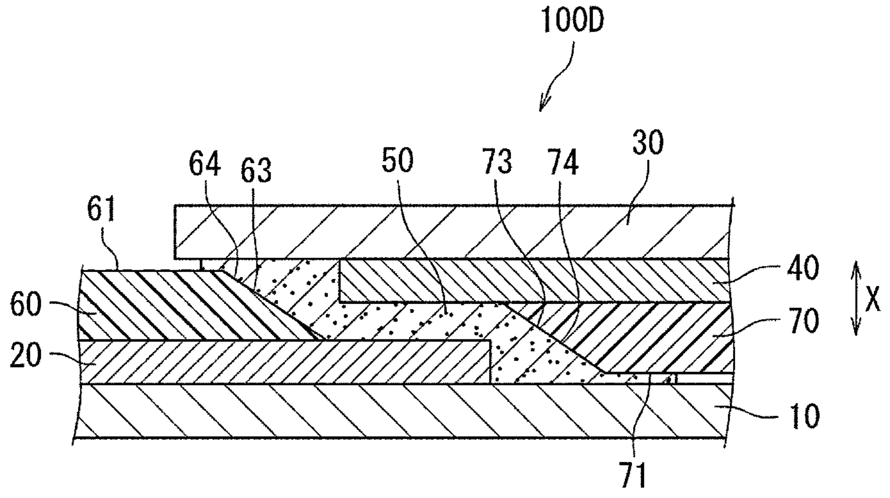
FIG. 6 is a partial sectional view schematically illustrating a stretchable device according to a fifth embodiment of the present disclosure.

A configuration of a stretchable device 100D according to a fifth embodiment will be described below with reference to FIG. 6. FIG. 6 is a partial sectional view schematically illustrating the stretchable device according to the fifth embodiment of the present disclosure.

As illustrated in FIG. 6, the fifth embodiment is different from the fourth embodiment in that the connection member 50 is in contact with the second main surfaces 61 and 71 of the protective layers in addition to the inclined surfaces 64 and 74 of the protective layers 60 and 70. According to the configuration, bonding regions between the connection member 50 and the protective layers can be further expanded as compared with the fourth embodiment. As a result, the occurrence of ion migration in the wirings can be prevented, and the connection reliability between the wirings can be more suitably improved.

Sixth Embodiment

Figure 7:
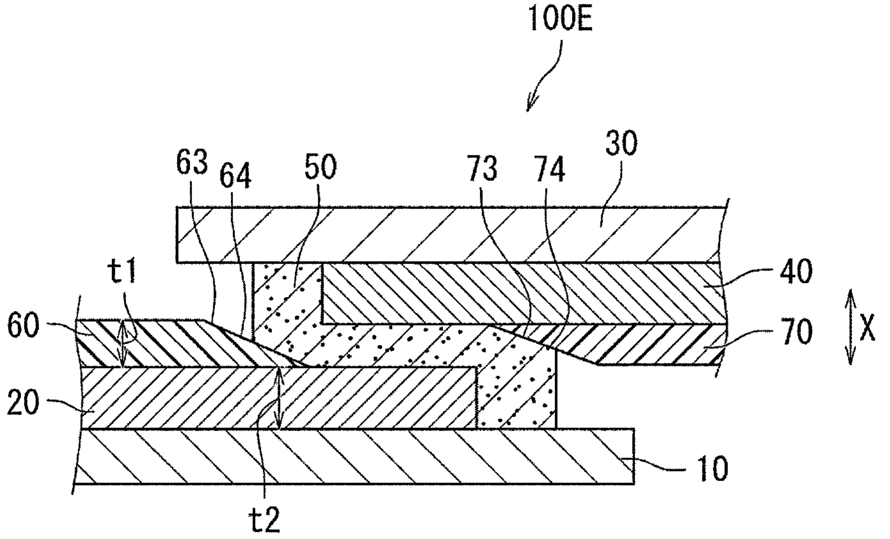
FIG. 7 is a partial sectional view schematically illustrating a stretchable device according to a sixth embodiment of the present disclosure.

A configuration of a stretchable device 100E according to a sixth embodiment will be described below with reference to FIG. 7. FIG. 7 is a partial sectional view schematically illustrating the stretchable device according to the sixth embodiment of the present disclosure.

As illustrated in FIG. 7, the sixth embodiment is characterized in that a thickness t1 of a protective layer that is at least one of the first protective layer 60 and the second protective layer 70 is smaller than a thickness t2 of the wiring 20, 40 covered with the protective layer. The thickness of the first wiring 20 and the thickness of the second wiring 40 may be the same or different.

According to this feature, the inclination angles of the inclined surfaces 64 and 74 of the protective layers can be made relatively small as compared with a case where the thickness t1 of the protective layer is larger than the thickness t2 of the wiring 20, 40. Therefore, the connection member 50 easily flows to the outer side of each wiring along the inclined surfaces at the time of pressure bonding. As a result, after completion of the pressure bonding, the protective layers 60 and 70 can be overlapped with the connection member 50 as viewed from the first direction. As a result, it can contribute to preventing the occurrence of ion migration in the wirings and securing the connection reliability between the wirings.

Seventh Embodiment

Figure 8:
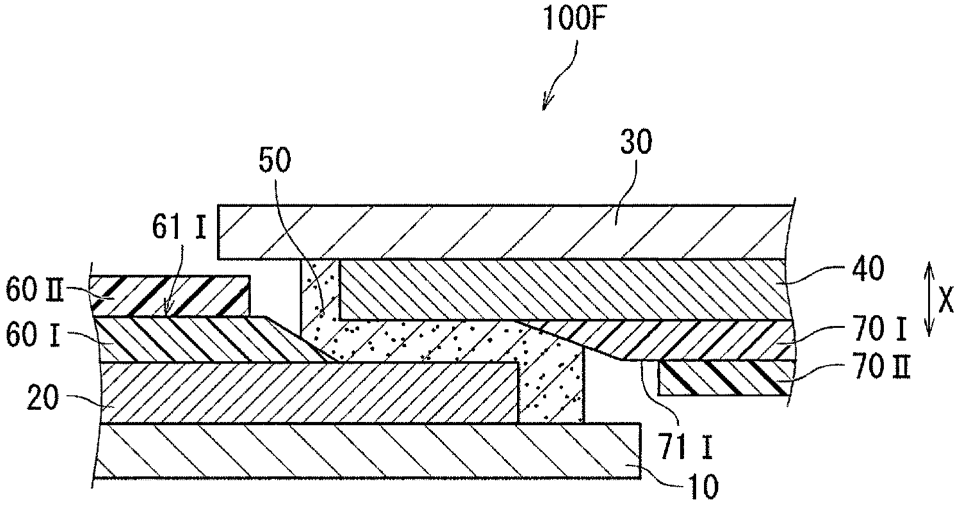
FIG. 8 is a partial sectional view schematically illustrating a stretchable device according to a seventh embodiment of the present disclosure.

A configuration of a stretchable device 100F according to a seventh embodiment will be described below with reference to FIG. 8. FIG. 8 is a partial sectional view schematically illustrating the stretchable device according to the seventh embodiment of the present disclosure.

As illustrated in FIG. 8, the seventh embodiment is characterized in that third protective layers 60II and 70II are further provided on second main surfaces 61I and 71I of a protective layer that is at least one of a first protective layer 601 and a second protective layer 70I.

According to this feature, when the connection member 50 leaks and spreads to the first protective layer 60I side and/or the second protective layer 70I side more than necessary (that is, to the outer side of the end surfaces of the wirings 20 and 40) at the time of pressure bonding, end surfaces of the third protective layers 60II and 70II can function as wall surfaces or stopper surfaces for suppressing the leakage and spreading of the connection member 50 more than necessary. As a result, the connection member 50 can suitably secure an amount necessary for electrical connection between the wirings 20 and 40. Even when the wirings expand and contract in the width direction in FIG. 2A, further deformation of the connection member 50 is suppressed as the wirings expand and contract. In addition, since the thicknesses of the protective layers covering portions exposed from the connection member 50 increase, ion migration can be more reliably suppressed.

Eighth Embodiment

Figure 9:
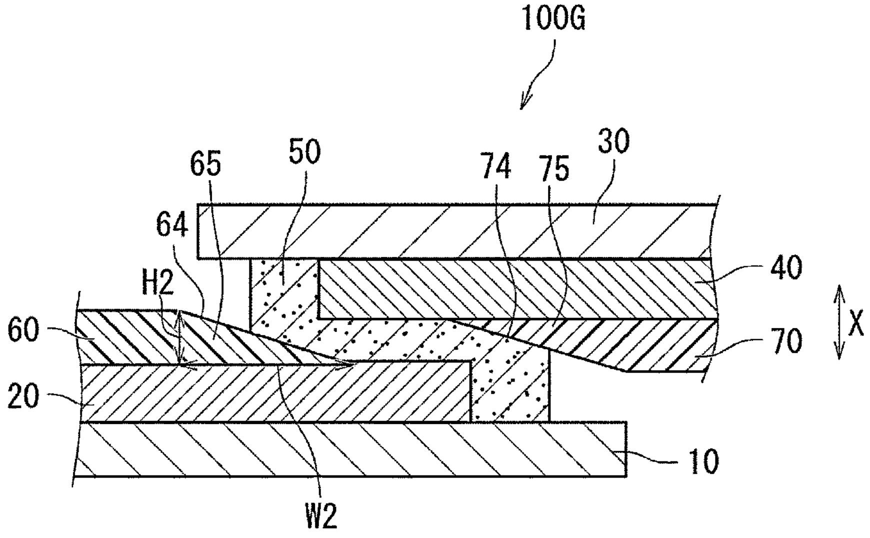
FIG. 9 is a partial sectional view schematically illustrating a stretchable device according to an eighth embodiment of the present disclosure.

A configuration of a stretchable device 100G according to an eighth embodiment will be described below with reference to FIG. 9. FIG. 9 is a partial sectional view schematically illustrating the stretchable device according to the eighth embodiment of the present disclosure.

As illustrated in FIG. 9, the eighth embodiment is characterized in that a width dimension W2 of the inclined portion 65 having the inclined surface 64 of a protective layer that is at least one of the first protective layer 60 and the second protective layer 70 is 2 times to 5 times, for example, 3 times as large as the maximum height dimension H2.

According to this feature, since the width dimensions W2 of the inclined portions 65 and 75 of the protective layers are larger than the maximum height dimension H2, the inclination angles of the inclined surfaces 64 and 74 of the protective layers can be made relatively small. Therefore, the connection member 50 easily flows to the outer side of each wiring along the inclined surfaces at the time of pressure bonding. As a result, after completion of the pressure bonding, the protective layers 60 and 70 can be overlapped with the connection member 50 as viewed from the first direction. As a result, it can contribute to preventing the occurrence of ion migration in the wirings and securing the connection reliability between the wirings.

Ninth Embodiment

Figure 10:
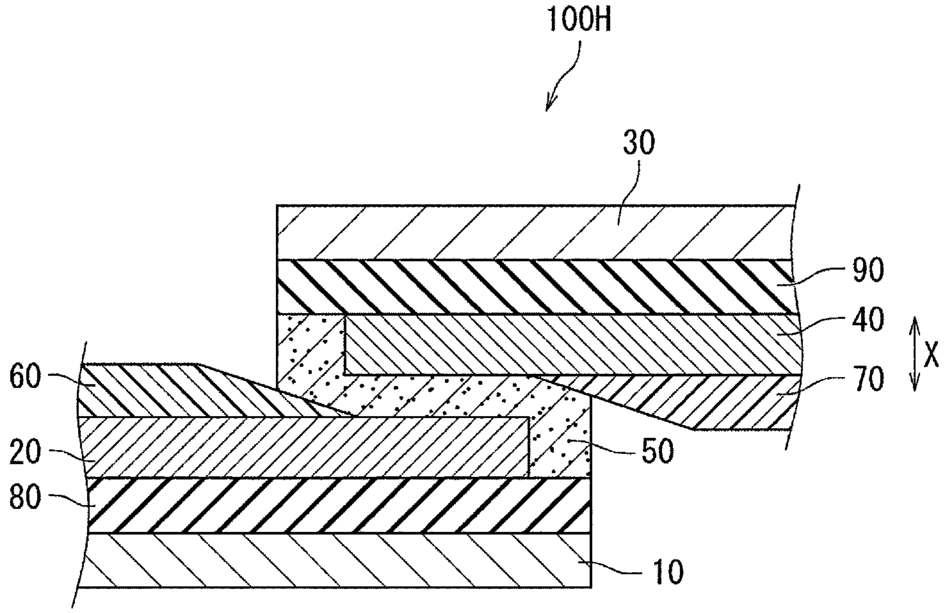
FIG. 10 is a partial sectional view schematically illustrating a stretchable device according to a ninth embodiment of the present disclosure.

A configuration of a stretchable device 100H according to a ninth embodiment will be described below with reference to FIG. 10. FIG. 10 is a partial sectional view schematically illustrating the stretchable device according to the ninth embodiment of the present disclosure.

The ninth embodiment is characterized in that insulating layers 80 and 90 are further provided between a substrate that is at least one of the first substrate 10 and the second substrate 30 and the wirings 20 and 40 provided on the substrate.

The insulating layers 80 and 90 are resin formed by printing. Specifically, a resin material or a mixture of a resin material and an inorganic material is preferable. Examples of the resin material include elastomer-based resins such as urethane-based, styrene-based, olefin-based, silicone-based, fluorine-based, nitrile rubber, latex rubber, vinyl chloride, ester-based, and amide-based resins, epoxy, phenol, acrylic, polyester, imide-based, rosin, cellulose, polyethylene terephthalate-based, polyethylene naphthalate-based, and polycarbonate-based resins. Each of the insulating layers 80 and 90 may not be made of a single material.

As illustrated in FIG. 10, the insulating layers 80 and 90 are disposed between the substrates and the wirings in the first direction. When the first substrate 10 and/or the second substrate 30 are stretchable, moisture may enter from the substrates to the wiring side, and ion migration may occur. In this regard, by providing the insulating layers 80 and 90, entry of moisture from the substrates to the wiring side can be suppressed.

For example, the insulating layers 80 and 90 may be disposed so as to cover only the lower surfaces of the wirings, or may be disposed at a portion where the wirings on the substrates are not present. Furthermore, the insulating layers 80 and 90 may be disposed so as to cover the entire substrates. Further, the insulating layers 80 and 90 only need to be in contact with the wirings, and different additional layers may be disposed between the substrates and the insulating layers 80 and 90.

Tenth Embodiment

Figure 11:
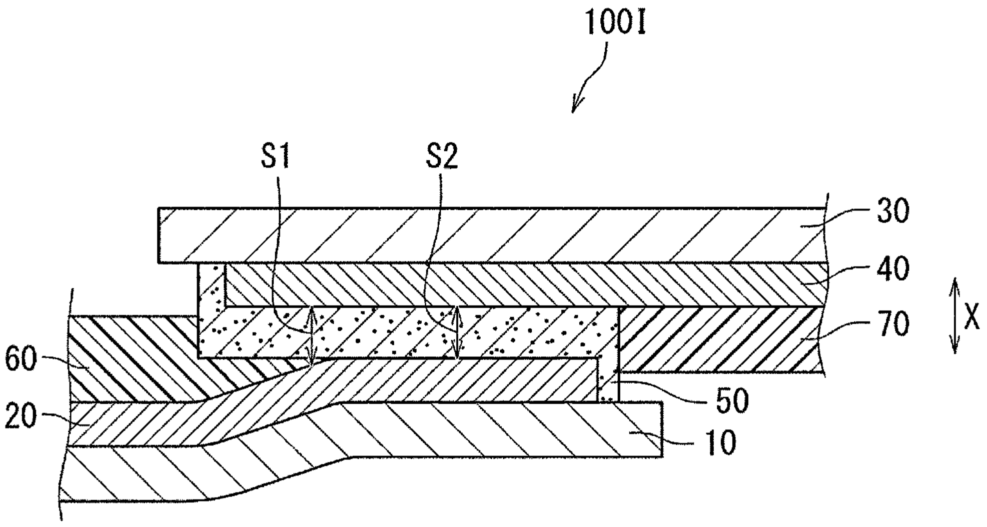
FIG. 11 is a partial sectional view schematically illustrating a stretchable device according to a tenth embodiment of the present disclosure.

A configuration of a stretchable device 100I according to a tenth embodiment will be described below with reference to FIG. 11. FIG. 11 is a partial sectional view schematically illustrating the stretchable device according to the tenth embodiment of the present disclosure.

The tenth embodiment is different from the first to ninth embodiments in that an arrangement and a shape of at least one of a first substrate 10 and a second substrate 30 are different. Specifically, in a case where a part of a protective layer that is at least one of the first protective layer 60 and the second protective layer 70 overlaps the connection region 51, the first substrate 10 and/or the second substrate 30 may be deformed. As an example, a part of the first protective layer 60 overlaps the connection region 51 as viewed from the first direction X (see FIG. 11). In this case, the first substrate 10 may be deformed as illustrated in FIG. 11. Specifically, the first substrate 10 may be deformed so as to be further separated from the second substrate 30 in a region where the first protective layer 60 and the connection region 51 overlap as viewed from the first direction X.

In a case where the first substrate 10 is deformed so as to be further separated from the second substrate 30, as illustrated in FIG. 11, parts of the first wiring 20 and the first protective layer 60 overlapping a region included in the first substrate 10 and deformed are also further separated from the second substrate 30. In other words, the shortest distance between the first protective layer 60 and the second substrate 30 increases. As a result, the shortest distance between the first substrate 10 and the second substrate 30 in the first direction X at a portion where the first protective layer 60 and the connection region 51 overlap can be made longer than the shortest distance between the first substrate 10 and the second substrate 30 in the first direction X at a portion where the first protective layer 60 and the connection region 51 do not overlap.

Specifically, since the first wiring 20 may be deformed together with the first substrate 10, the shortest distance S1 between the first wiring 60 and the second wiring 70 in the first direction X at the portion where the first protective layer 60 and the connection region 51 overlap can be made longer than the shortest distance S2 between the first wiring 60 and the second wiring 70 in the first direction X at the portion where the first protective layer 60 and the connection region 51 do not overlap. As a result, in a state where a part of the first protective layer 60 is disposed so as to overlap the connection region 51, it is possible to secure a room for the connection member 50 to flow. Therefore, the connection reliability can be improved while suppressing ion migration in the first wiring 20.

The shape of the portion of the first protective layer 60 overlapping the connection region 51 as viewed from the first direction is not particularly limited, and may be a rectangular shape. Although FIG. 11 illustrates the case where the first substrate 10 is deformed, the second substrate 30 may be deformed, or both the first substrate 10 and the second substrate 30 may be deformed.

Preferably, the second substrate 30 and the first protective layer 60 are separated from each other. With the above configuration, the room for the connection member 50 to flow can be further secured, and the area of contact between the first protective layer 60 and the connection member 50 is increased, so that the connection reliability can be improved.

Note that each of the embodiments and variations is an example, and the present disclosure is not limited to each of the embodiments. Each drawing illustrates an example of constituent elements, and does not limit shapes. Further, partial replacement or combination of configurations illustrated in different embodiments and variations is possible.

The present disclosure can adopt the following aspects.

<1> A stretchable device including: a first substrate; a stretchable first wiring on the first substrate; a second substrate facing the first substrate in a first direction that is a thickness direction of the first substrate; a stretchable second wiring on the second substrate; a first protective layer covering a part of the stretchable first wiring; a second protective layer covering a part of the stretchable second wiring; and a connection member in contact with an outer surface at an end portion of each of the stretchable first wiring and the stretchable second wiring so as to electrically connect the stretchable first wiring and the stretchable second wiring, and in contact with an end surface of each of the first protective layer and the second protective layer, wherein at least a pair out of (1) the first protective layer and the stretchable second wiring and (2) the second protective layer and the stretchable first wiring is separated from each other with the connection member interposed therebetween.

<2> The stretchable device according to <1>, in which the outer surface of the stretchable first wiring is covered with the connection member and the first protective layer, and the outer surface of the stretchable second wiring is covered with the connection member and the second protective layer.

<3> The stretchable device according to <1> or <2>, in which at least one of the first protective layer and the second protective layer overlaps the connection member as viewed from the first direction.

<4> The stretchable device according to any one of <1> to <3>, in which the connection member covers an entirety of the outer surface of at least one of the stretchable first wiring and the stretchable second wiring.

<5> The stretchable device according to any one of <1> to <4>, in which the connection member is in contact with at least one of the first substrate and the second substrate.

<6> The stretchable device according to any one of <1> to <5>, in which the end surface of at least one of the first protective layer and the second protective layer includes an inclined surface.

<7> The stretchable device according to <6>, in which a part of the connection member is in contact with at least one of the stretchable first wiring and the stretchable second wiring along a longitudinal direction of the at least one of the stretchable first wiring and the stretchable second wiring.

<8> The stretchable device according to <6> or <7>, in which a thickness of at least one of the first protective layer and the second protective layer is smaller than a thickness of at least one of the stretchable first wiring and the stretchable second wiring covered with the at least one of the first protective layer and the second protective layer.

<9> The stretchable device according to any one of <1> to <8>, in which the stretchable first wiring and the stretchable second wiring face each other as viewed from the first direction, and a part of at least one of the first protective layer and the second protective layer overlaps a connection region included in the connection member and electrically connecting the stretchable first wiring and the stretchable second wiring.

<10> The stretchable device according to <9>, in which a shortest distance between the stretchable first wiring and the stretchable second wiring in the first direction at a portion where the connection region and the first protective layer and the second protective layer overlap is longer than a shortest distance between the stretchable first wiring and the stretchable second wiring in the first direction at a portion where the connection region and the first protective layer and the second protective layer do not overlap.

<11> The stretchable device according to any one of <1> to <8>, in which the end surface of at least one of the first protective layer and the second protective layer is a vertical surface.

<12> The stretchable device according to <11>, in which the vertical surface is on an outer side of the end surface of the stretchable first wiring or the stretchable second wiring.

<13> The stretchable device according to any of <1> to <12>, in which each of the first protective layer and the second protective layer includes a first main surface in contact with the stretchable first wiring and the stretchable second wiring, respectively, and a second main surface opposed to the first main surface, and the connection member is in contact with the second main surface of at least one of the first protective layer and the second protective layer.

<14> The stretchable device according to <13>, further including a third protective layer on the second main surface of at least one of the first protective layer and the second protective layer.

<15> The stretchable device according to any one of <1> to <14>, further including an insulating layer between at least one of (1) the first substrate and the first wiring and (2) the second substrate and the second wiring.

<16> The stretchable device according to any one of <1> to <15>, in which the protective layer located on a first of the first substrate and the second substrate and an end portion of a second of the first substrate and the second substrate face each other as viewed from the first direction.

<17> The stretchable device according to any one of <1> to <16>, in which the first protective layer and the second protective layer have insulating properties.

<18> The stretchable device according to any one of <1> to <17>, in which the connection member contains a plurality of conductive particles.

The stretchable device of the present disclosure can be used by being worn on a human body.

DESCRIPTION OF REFERENCE SYMBOLS

100, 100A to 100I: Stretchable device
10: First substrate
11: End portion of first substrate
20: First wiring
21: End portion of first wiring
22: End surface of end portion 21 of first wiring
23: Main surface of first wiring
24: Outer surface of first wiring
30: Second substrate
31: End portion of second substrate
40: Second wiring
41: End portion of second wiring
42: End surface of end portion 41 of second wiring
43: Main surface of second wiring
44: Outer surface of second wiring
50: Connection member

51: Connection region (connection region of connection member 50 connecting first wiring 20 and second wiring 40)
60, 60I: First protective layer
60II: Third protective layer
61, 61I: Second main surface of first protective layer
62: First main surface of first protective layer
63: End surface connecting first main surface 62 and second main surface 61 of first protective layer
64: Inclined surface of first protective layer
65: Inclined portion of first protective layer
70, 70I: Second protective layer
70II: Third protective layer
71, 71I: Second main surface of second protective layer
72: First main surface of second protective layer
73: End surface connecting first main surface 72 and second main surface 71 of second protective layer
74: Inclined surface of second protective layer
75: Inclined portion of second protective layer
80: Insulating layer
90: Insulating layer
H1: Maximum height dimension of inclined portion
L: Width of inclined portion
L1: Width dimension of connection region
S1: Shortest distance between first wiring and second wiring in first direction at portion where first protective layer and connection region overlap
S2: Shortest distance between first wiring and second wiring in first direction at portion where first protective layer and connection region do not overlap
T: Height of inclined portion
t1: Thickness of protective layer
t2: Thickness of wiring
W1: Width dimension of inclined portion
X: First direction
X1: Maximum dimension of thickness (in vertical direction) of protective layer

The invention claimed is:

1. A stretchable device comprising: a first substrate; a stretchable first wiring on the first substrate; a second substrate facing the first substrate in a first direction that is a thickness direction of the first substrate; a stretchable second wiring on the second substrate; a first protective layer covering a part of the stretchable first wiring; a second protective layer covering a part of the stretchable second wiring; and a connection member in contact with an outer surface at an end portion of each of the stretchable first wiring and the stretchable second wiring so as to electrically connect the stretchable first wiring and the stretchable second wiring, and in contact with an end surface of each of the first protective layer and the second protective layer, wherein at least a pair out of the first protective layer and the stretchable second wiring and the second protective layer and the stretchable first wiring is separated from each other with the connection member interposed therebetween, wherein the outer surface of the stretchable first wiring is covered with the connection member and the first protective layer, and the outer surface of the stretchable second wiring is covered with the connection member and the second protective layer.

2. The stretchable device according to claim 1, wherein at least one of the first protective layer and the second protective layer overlaps the connection member as viewed from the first direction.

3. The stretchable device according to claim 1, wherein at least one of the first protective layer and the second protective layer overlaps the connection member as viewed from the first direction.

4. The stretchable device according to claim 1, wherein the connection member covers an entirety of the outer surface of at least one of the stretchable first wiring and the stretchable second wiring.

5. The stretchable device according to claim 1, wherein the connection member is in contact with at least one of the first substrate and the second substrate.

6. The stretchable device according to claim 1, wherein the end surface of at least one of the first protective layer and the second protective layer includes an inclined surface.

7. The stretchable device according to claim 6, wherein a part of the connection member is in contact with the inclined surface so as to extend upward from a side in contact with at least one of the stretchable first wiring and the stretchable second wiring along a longitudinal direction of the at least one of the stretchable first wiring and the stretchable second wiring.

8. The stretchable device according to claim 6, wherein a thickness of at least one of the first protective layer and the second protective layer is smaller than a thickness of at least one of the stretchable first wiring and the stretchable second wiring covered with the at least one of the first protective layer and the second protective layer.

9. The stretchable device according to claim 1, wherein the end surface of each of the first protective layer and the second protective layer is an inclined surface.

10. The stretchable device according to claim 1, wherein the stretchable first wiring and the stretchable second wiring face each other as viewed from the first direction, and a part of at least one of the first protective layer and the second protective layer overlaps a connection region included in the connection member and electrically connecting the stretchable first wiring and the stretchable second wiring.

11. The stretchable device according to claim 10, wherein a shortest distance between the stretchable first wiring and the stretchable second wiring in the first direction at a portion where the connection region and the first protective layer and the second protective layer overlap is longer than a shortest distance between the stretchable first wiring and the stretchable second wiring in the first direction at a portion where the connection region and the first protective layer and the second protective layer do not overlap.

12. The stretchable device according to claim 1, wherein the end surface of at least one of the first protective layer and the second protective layer is a vertical surface.

13. The stretchable device according to claim 12, wherein the vertical surface is on an outer side of the end surface of the stretchable first wiring or the stretchable second wiring.

14. The stretchable device according to claim 1, wherein
each of the first protective layer and the second protective layer includes a first main surface in contact with the stretchable first wiring and the stretchable second wiring, respectively, and a second main surface opposed to the first main surface, and
the connection member is in contact with the second main surface of at least one of the first protective layer and the second protective layer.

15. The stretchable device according to claim 14, further comprising a third protective layer on the second main surface of at least one of the first protective layer and the second protective layer.

16. The stretchable device according to claim 1, further comprising an insulating layer between at least one of (1) the first substrate and the first wiring and (2) the second substrate and the second wiring.

17. The stretchable device according to claim 1, wherein the protective layer located on a first of the first substrate and the second substrate and an end portion of a second of the first substrate and the second substrate face each other as viewed from the first direction.

18. The stretchable device according to claim 1, wherein the first protective layer and the second protective layer have insulating properties.

19. The stretchable device according to claim 1, wherein the connection member contains a plurality of conductive particles.

* * * * *